US006473595B1

(12) United States Patent
Kim et al.

(10) Patent No.: US 6,473,595 B1
(45) Date of Patent: Oct. 29, 2002

(54) RF ACTIVE BALUN CIRCUIT FOR IMPROVING SMALL-SIGNAL LINEARITY

(75) Inventors: Chung Hwan Kim, Taejon (KR); Cheon Soo Kim, Taejon (KR); Hyun Kyu Yu, Taejon (KR); Min Park, Taejon (KR); Dae Yong Kim, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/437,312

(22) Filed: Nov. 10, 1999

(30) Foreign Application Priority Data

Dec. 1, 1998 (KR) .............................................. 98-52342

(51) Int. Cl.$^7$ .............................. H04B 1/10; H03F 1/26
(52) U.S. Cl. ...................... 455/63; 455/114; 455/253.2; 330/149
(58) Field of Search .......................... 455/63, 69, 67.3, 455/67.4, 241.1, 251.1, 253.2, 114; 330/149, 254, 277, 294, 302, 307; 375/296, 297

(56) References Cited

U.S. PATENT DOCUMENTS

| 4,011,518 A | | 3/1977 | Irvine et al. .................. 330/23 |
| 4,588,958 A | * | 5/1986 | Katz ........................... 330/149 |
| 4,638,261 A | | 1/1987 | McGuire et al. ............. 330/277 |
| 5,099,204 A | | 3/1992 | Wheatley, III .............. 330/279 |
| 5,523,716 A | * | 6/1996 | Grebliunas ................... 330/149 |
| 5,606,286 A | * | 2/1997 | Bains .......................... 330/149 |
| 6,232,836 B1 | * | 5/2001 | Zhou ........................... 330/149 |

OTHER PUBLICATIONS

"A Linearization Technique for CMOS RF Power Amplifiers" by S. Tanaka et al., 1997 Symposium on VLSI Circuits Digest of Technical Papers, pp. 93–94.

"A Self Phase Distortion Compensation Technique for Linear Power Amplifiers" by Hitoshi Hayashi et al., 1994 Asia Pacific Microwave Conference, pp. 555–558.

"Technical Memorandum Feedforward Linearisation of 950 MHz Amplifiers" by IEEE Proceedings, vol. 135, Pt. H. No. 5, Oct. 1988, pp. 347–350.

"Cuber Predistortion Linearizer for Relay Equipment in 800 MHz Band Land Mobile Telephone System" by Toshio Nojma et al., IEEE Transactions on Vehicular Technology, vol. VT–34, No. 1, Nov. 1985, pp. 169–177.

"Backoff Improvement of an 800–MHz GaAs FET Amplifier for a QPSK Transmitter Using an Adaptive Nonlinear Distortion Canceller", by Minowa et al., CH2846–4/90/0000–0542 1999 IEEE, pp. 542–546.

* cited by examiner

Primary Examiner—Vivian Chin
Assistant Examiner—John J Lee
(74) Attorney, Agent, or Firm—Antonelli, Terry, Stout & Kraus, LLP

(57) ABSTRACT

The RF active balun circuit for improving a small-signal linearity in a power amplifying circuit of a CDMA system is provided under the construction of a signal amplifier driven by exterior individual direct current gate power VGG1, VGG2, for receiving a communication input signal AC-In and performing a cascode amplification at a normal operation point where a feedback third-order distortion signal becomes large; a distortion signal generator driven by exterior direct current gate power VGG3 different from the above power, for generating the communication input signal AC-In as the third-order distortion signal by nonlinearity of an active element to cancel the third-order distortion signal amplified in the signal amplifier; and an insulator provided for an insulation from a exterior driving power VGG3 applied to the distortion signal generator, thereby maintaining the small size, lower power and high efficient terminal characteristics by using a gain based on gate voltage of FET and the nonlinearity characteristic difference, and improving the linearity of an IC operating by a small signal or medium signal.

20 Claims, 5 Drawing Sheets

RF ACTIVE BALUN CIRCUIT FOR IMPROVING SMALL-SIGNAL LINEARITY

BACKGROUND OF THE INVENTION

1. Field of the Invention

The present invention relates to a circuit for heightening a linearity in a power amplifying circuit of a CDMA system, and more particularly, to an RF active balun circuit for improving a small-signal linearity by using an active element balun.

2. Description of the Prior Art

A communication method having a larger capacity than the existing method has been required to meet the explosive demand for greater and more efficient communication. As a result, a digital system capable of accommodating more users was invented.

This digital system is classified into a time division multiple access(TDMA) and a code division multiple access (CDMA). The CDMA system has a merit for the maximum accommodating capacity. A main subject for linearity is generally to heighten the linearity of a power amplifying circuit since the most serious problem for the linearity is caused in the power amplifying circuit used to amplify a signal.

However, the CDMA system uses a diffusion spectrum, in which several users communicate within the same channel frequency. Therefore, the linearity is needed not only in the power amplifying circuits but also in other hardware, more and more in comparison with other methods. In a CDMA receiving terminal the maximum power inputted to an antenna is −25 dBm according to IS-95 as a standard of the CDMA terminal, so the linearity of a small signal in the receiving terminal circuit becomes an important standard.

There are several methods of heightening a linearity of an amplifier in a system level. For example, a predistortion method, "Cuber Predistortion Linearizer for Relay Equipment in 800 MHz Band Land Mobile Telephone System" by T. Nojima et al., in IEEE Trans. Veh., vol. VT-34, No. 4, Nov. 1985, pp. 169–177, is described to generate a third-order distortion signal and appropriately control its phase and size so as to offset it by a third-order distortion signal generated in case that there is no predistortion.

As a first embodiment of such conventional technique, FIG. 1 represents a circuit diagram using a predistortion method for improving linearity.

With reference to FIG. 1, input and output terminals in this circuit each have a divider 1 for providing mutually different transfer paths of a predistortion signal and an existing signal and a combiner 5 for combining two signals. The path of the predistortion signal is composed of a third-order distortion generator 2, a signal attenuator 3 for controlling a magnitude of a signal so that the magnitude of the third-order distortion signals becomes same after the combination of the signals and their phases are inverted to thereby gain a mutual offset between the distortion signals, and a phase shifter 4 for controlling a phase.

As a second embodiment of the conventional technique, FIG. 2 shows a circuit diagram using a feed-forward-cancellation method for improving the linearity, which is "Feedforward Linearization of 950 MHz Amplifiers" by R. D. Stewart et al., in IEEE Proceedings, vol.135, No.5, October 1988, pp.347–350.

Referring to FIG. 2, in an input terminal of an auxiliary amplifier, a linear signal of the input terminal is divided through a coupler 6, and the divided signal is transferred to the input terminal of the auxiliary amplifier 9 through a phase shifter 7 and a coupler 8. An output signal amplified in a main amplifier 10 is transferred to the input terminal of the auxiliary amplifier 9 through a coupler 11, a signal attenuator 12 and the coupler 8. At this time, the original signal is cancelled by controlling the signal attenuator 12 and the phase shifter 7 and the auxiliary amplifier 8 amplifies only the third-order distortion signal. The third-order distortion signal outputted through the auxiliary amplifier is combined with the signal of the main amplifier 10 through the coupler 6, and a offset of the third-order distortion signal occurs by controlling an amplification extent of the auxiliary amplifier and a phase of the phase shifter 7 to thus improve the linearity.

As a third embodiment of the conventional technique, FIG. 3 shows a circuit using the cartesian-feedback method to improve the linearity, "Backoff Improvement of an 800 MHz GaAs FET Amplifier for a QPSK Transmitter using an Adaptive Nonlinear Distortion Canceller" by M. Minowa et al., in 40th Veh Tech. Conf., 1990, pp. 542–546.

Referring to FIG. 3, a signal outputted from a main amplifier 15 is feedback through a coupler 16, an auxiliary amplifier 17, a coupler 18 and a phase shifter 19 to an input terminal thereof. Herewith, the third-order distortion signal is cancelled by controlling a phase in the phase shifter 19.

The above conventional circuits have an effect in improving the linearity, but as shown in FIGS. 1 through 3, the circuits may become very complicated, which may also cause the circuits of a big size not suitable for a use of a terminal.

In another conventional technique a transistor-level circuit technique is to offset a phase distortion in a cascade amplifier by using such a characteristic that a phase change between an input signal and its corresponding output signal becomes mutually opposite in field effect transistors(FET) of a common-source terminal and a common-gate terminal, as disclosed in "A Self Phase Distortion Compensation Technique for Linear Power Amplifiers" by H. Hayashe et al., in 1994 Asia Pacific Microwave Conf., 1994, pp.555–558. However, the phase change of a scattering coefficient S21 is the phenomenon represented from a large signal, such a signal is applied to a power amplifier and not the cascade amplifier.

Further, Tanaka had utilized such a technique that a cancellation of a third-order distortion signal in an output terminal is made by connecting in parallel two FETs having bias so as to operate in two operation regions by use of a characteristic that a third-order distortion signal component of transconductance most largely influencing upon an FET nonlinearity characteristic becomes different in its sign at a saturation region and a triode region. This technique is disclosed in the article, "A Linearization Technique for CMOS RF Power Amplifiers", by S. Tanaka et al., in Symp. On VLSI Digest, 1997, pp.93–94. But it is not a general characteristic that the third-order distortion signal component of the trans-conductance in the triode region becomes different concerning its signs in the saturation region and the triode region, as disclosed in the article, "Modeling MES-FET's for Intermodulation Analysis of Mixers and Amplifiers" by S. A. Mass et al., in IEEE Trans. Micro. Tech., vol. 38, December 1990, pp.1964–1971. Therefore this method is only applicable to a specific case.

Such conventional methods are almost limited to a power element for use of a base station, the power element being dull to a difficult degree, size and power consumption of a circuit to be embodied. Even though it is the method for the sake of the small size, low power and high efficiency of the circuit, this effect is provided from the large signal operation. That is, the conventional methods may be not directly applicable to the embodying circuits for improving a linearity of a small signal.

SUMMARY OF THE INVENTION

Accordingly, the present invention is directed to an RF active balun circuit for improving a small-signal linearity that substantially obviate one or more of the limitations and disadvantages of the related art.

A primary object of the present invention is to provide an RF active balun circuit for improving a linearity of an IC operating by a small-signal or a medium power by use of a nonlinearity characteristic difference according to gate voltage of an FET, maintaining a terminal characteristic based on a small size, lower power and high efficiency.

To achieve the above object of the present invention, the RF active balun circuit for improving a linearity of a small-signal comprises a signal amplifier driven by exterior individual direct current power, for receiving a communication input signal and performing a cascade amplification at a normal operation point where a feedback third-order distortion signal becomes large; a distortion signal generator driven by exterior direct current power different from the above power, for generating a communication input signal as a third-order distortion signal by a nonlinearity of an active element in order to cancel the third-order distortion signal amplified in the signal amplifier; and an insulator provided for an insulation from the exterior driving power applied to the distortion signal generator.

The signal amplifier is made up of at least two common-source FETs. The at least two common-source FETs are connected in a cascade and used as a main amplification source of a signal. Also, the distortion signal generator uses at least one common-source FET having a drain connected to a drain of said one common-source FET and a gate connected between a source of said one common-source FET and a drain of said another common-source FET. The insulator uses a capacitor.

Under such construction of the present invention, the smaller such a third-order differential value g3 of the gate voltage for the drain current in the FET is, the more the linearity of the third-order distortion signal is improved. That is to say, the third-order intermodulation(IP3) is improved by using a characteristic of the FET, wherein the characteristic is that when a consumption of current is small, namely when a linear gain of a signal is small, the magnitude of g3 becomes large, and that when a consumption of current is large, in other words, when the linear gain of the signal is large, the magnitude of the signal becomes small.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENT

Reference will now be made in detail to the preferred embodiments of the present invention, examples of which are illustrated in the accompanying drawings.

In accordance with the present invention, an RF integrated circuit(IC) corresponding to a transistor-class, for heightening a linearity of the IC operating at a small-signal or a medium power is provided, maintaining a terminal characteristic based on a small size, low power and high efficiency by using the above mentioned principles.

Figure 1:
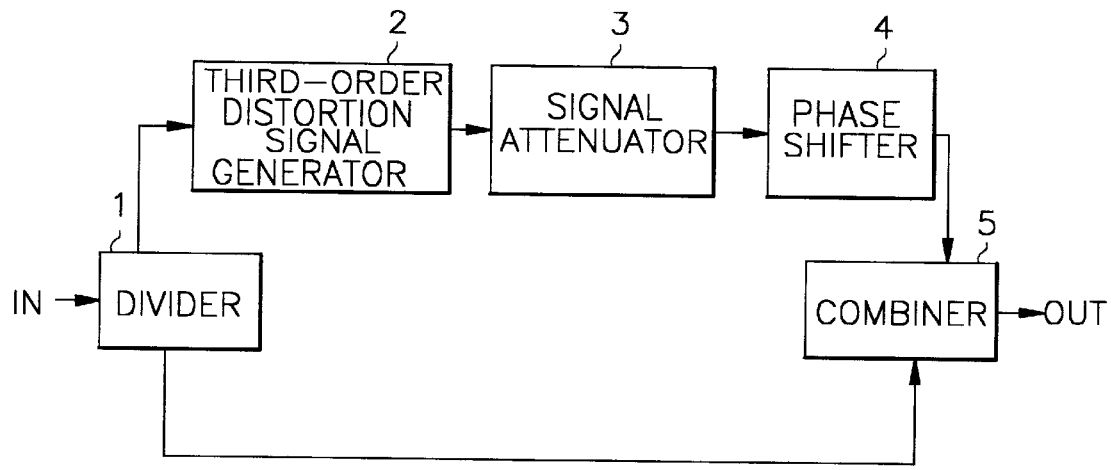
FIG. 1 is a circuit diagram for improving linearity by using a predistortion method in a first embodiment of a conventional technique.
Figure 2:
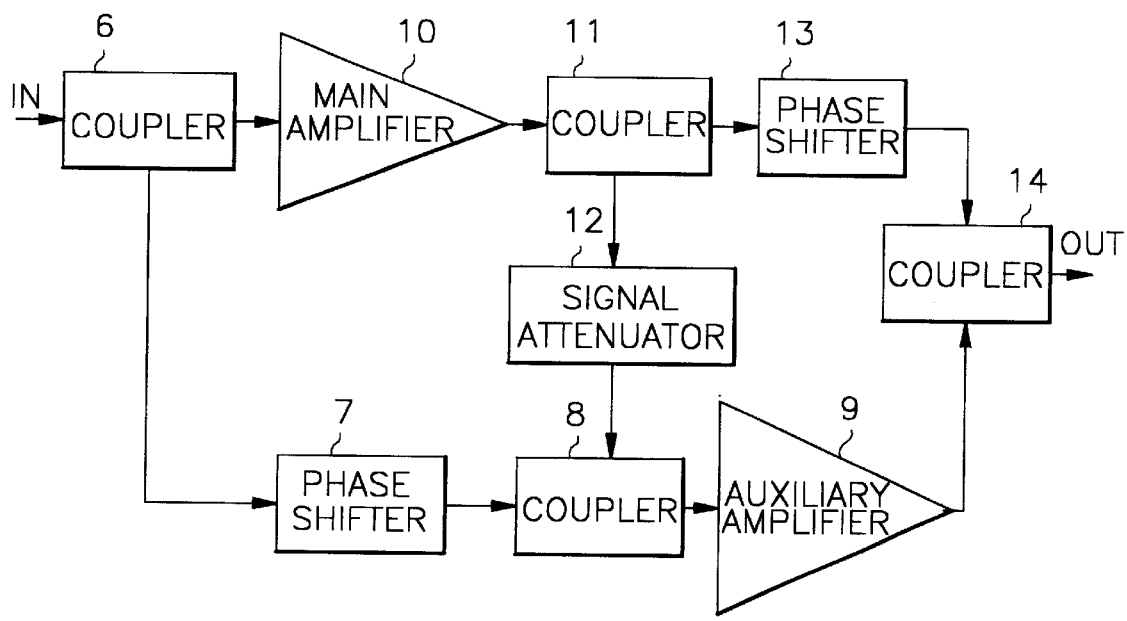
FIG. 2 shows a circuit diagram for improving the linearity by using a feed-forward-cancellation method in a second embodiment of the conventional technique.
Figure 3:
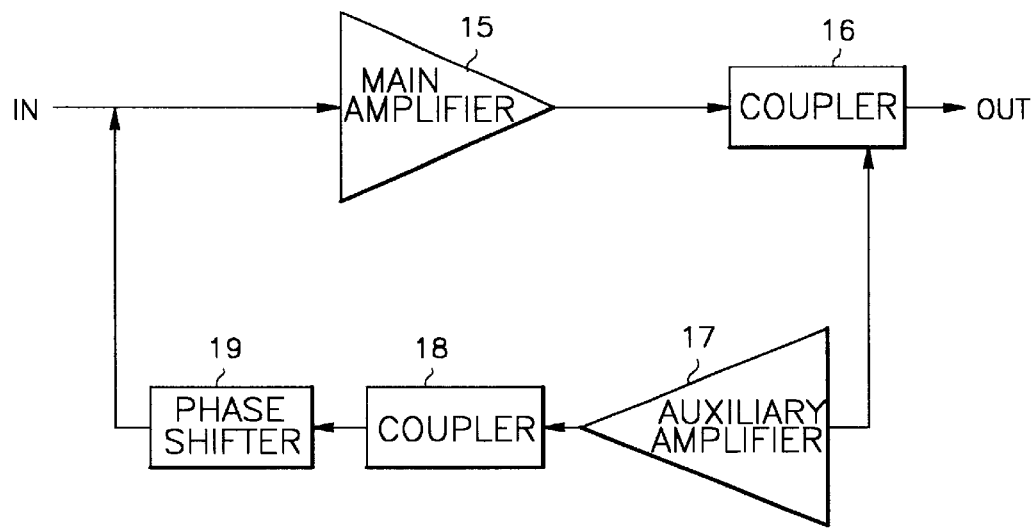
FIG. 3 shows a circuit diagram for improving the linearity by using a Cartesian-feedback method in a third embodiment of the conventional technique.
Figure 4A:
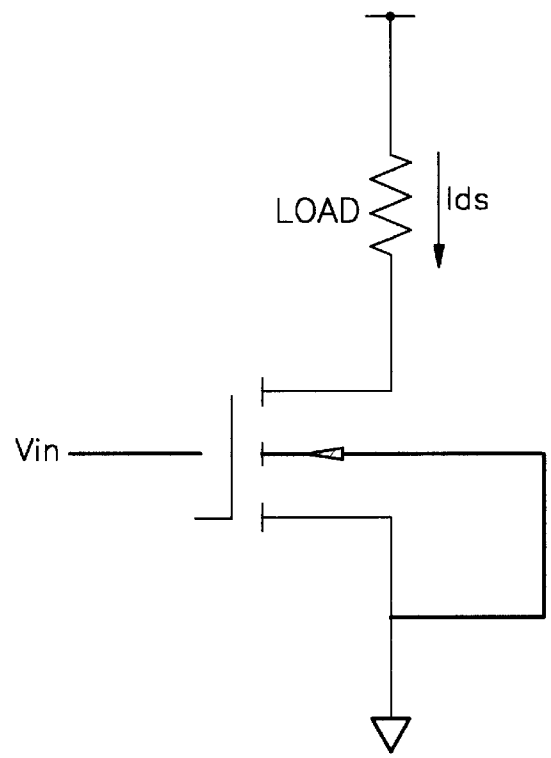
FIG. 4a shows a common-source FET circuit.

The characteristic of an input voltage-output current represented as a 2-D Macaurin series which considers the first-order through the third-order nonlinearity in an FET of a common-source terminal shown in FIG. 4a, may be indicated as the following numeric expression 1, as disclosed in "Effects of Bias and Load on MESFET Nonlinear Characteristics" by G. Passiopoulos et al., in IEEE Electronic Lett., vol.32, No.8. 1996, pp.741–743.

[Numeric Expression 1]

$$i_{ds} = g_1 \cdot v_{gs}(t) + \frac{g_2}{2!} \cdot v_{gs}(t)^2 + \frac{g_3}{3!} \cdot v_{gs}(t)^3 + g_{ds1} \cdot v_{ds}(t) + \frac{g_{ds2}}{2!} \cdot v_{ds}(t)^2 +$$
$$\frac{g_{ds3}}{3!} \cdot v_{ds}(t)^3 + m_{11} v_{ds}(t) v_{gs}(t) + m_{12} v_{ds}(t) v_{gs}(t)^2 + m_{21} v_{ds}(t)^2 v_{gs}(t)$$

In the numeric expression 1, $g_1$, $g_2$ and $g_3$ indicate the nonlinearity of a trans-conductance, and $g_{ds1}$, $g_{ds2}$ and $g_{ds3}$ represent the nonlinearity of an output conductance, and $m_{11}$, $m_{12}$ and $m_{21}$ respectively mean input-output composite signals concerned with a side differential of a signal mixture of an expansion. All coefficients in the numeric expression 1 strongly depend upon bias. Operating frequency is low enough so that an influence from the nonlinearity of a capacitance is not large, and if the magnitude of two input tone signals for which input frequency is each of $\omega_1$ and $\omega_2$ is same, a third-order distortion signal of current in an output terminal is proportionated to a polynomial of a voltage gain Av.

[Numeric Expression 2]

$$i_{ds}(2\omega_1 - \omega_2) \propto R_{\leq ff\nu \leq}(\omega_1)^3\left(\frac{g_3}{3!} \cdot v_{gs}(t)^3 + m_{12} \cdot A_v + m_{21} \cdot A_v^2 + \frac{g_{ds3}}{3!} \cdot A_v^3\right)$$

[Numeric Expression 3]

$$A_v = g_1 \cdot R_{\leq ff}$$

[Numberic Expresson 4]

In the above, the third-order nonlinear component $g_{ds3}$ of the output $$R_{\leq ff} = \frac{R_L}{1 + R_L \cdot g_{ds1}}$$

conductance among terms of the numeric expression 2 may be disregarded in the saturation region, and the third-order distortion signal of current in the output terminal is mainly decided by the magnitude of $g_3$, since in a low power type IC the gate voltage is not high and a voltage gain is not large in order to reduce the consumption current.

Figure 4B:
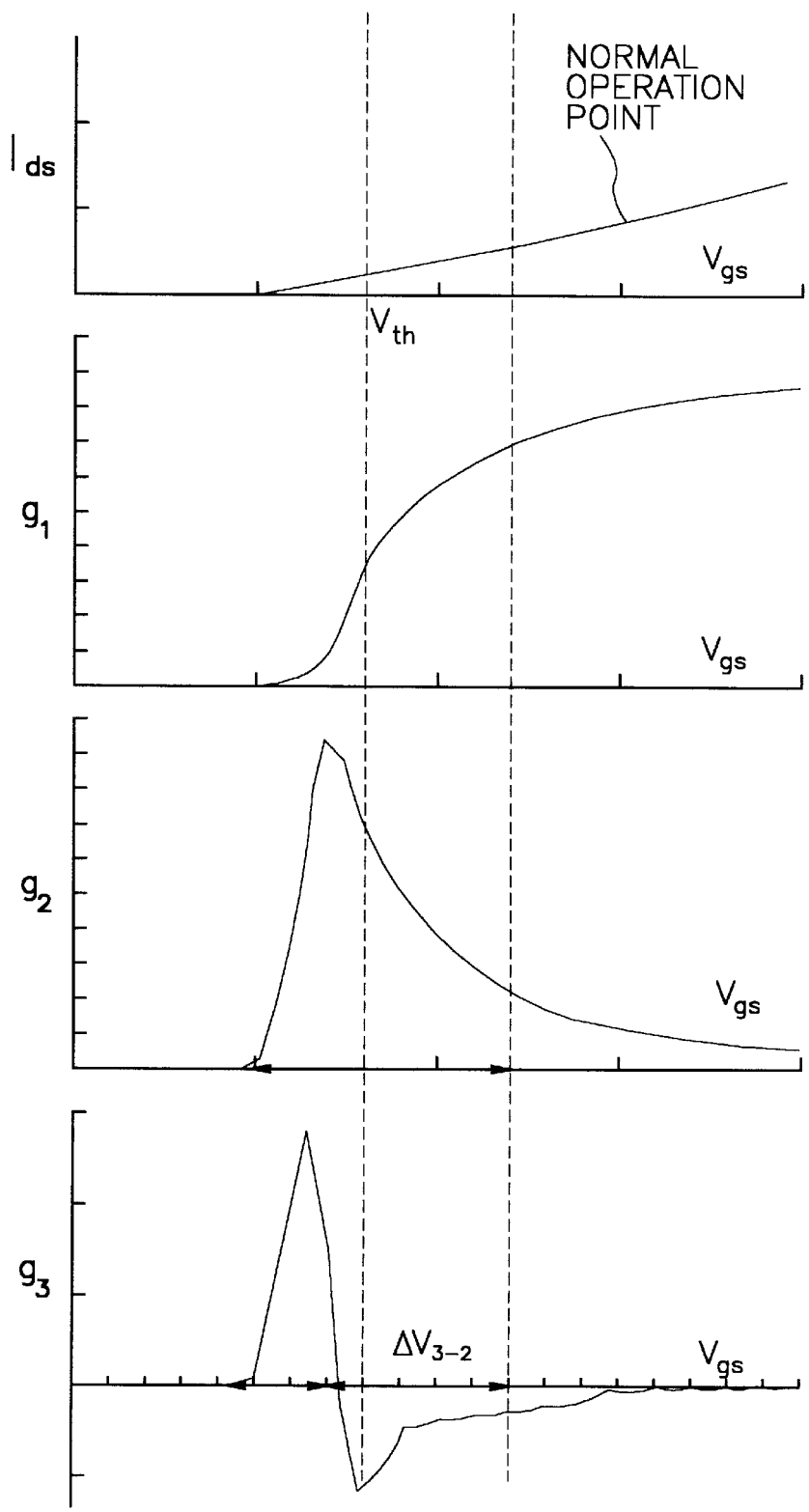
FIG. 4b shows a characteristic diagram providing a. current-voltage characteristic of FIG. 4a and first through third-order distortion coefficients of current-voltage.

As shown in FIG. 4b, further, the magnitude of $g_3$ is getting gradually lessened according that the gate voltage is getting increased at a point over a threshold voltage Vth, therefore it can be noted that the linearity is improved. But, the low consumption power type IC is limited in its power voltage and usable current quantity by a capacity of battery, and an IC for use of an RF is limited in the minimum size of the FET and the maximum magnitude of voltage addible to a gate, for the sake of a matching by an integrated element, thus it is not available to unlimitedly improve the linearity. Also, the most important point is not to minimize the magnitude of $g_3$ but also not to lessen the magnitude of a $g_1$ value too largely, in order to maximize the IP, since IP3 is proportioned to a square of a $g_1/g_3$ magnitude.

With reference to FIGS. 4a and 4b, if gate-source voltage Vgs is getting large, a rate of $g_1$ and $g_3$, namely the magnitude of $g_1/g_3$, is getting large. Oppositely, if the gate-source voltage Vgs is getting small, a rate of $g_1$ and $g_3$, namely the magnitude of $g_1/g_3$, is getting small, excepting the neighborhood of zero in $g_3$.

Accordingly, at a point where the Vgs value is small, the $g_3$ value is large and the $g_1$ value is small, thus, there is almost no amplifying ability of the basic signal $\omega_1$, $\omega_2$ in comparison with a general operation of the FET amplifier. In other words, since third-order distortion signals $2\omega_1-\omega_2$, $2\omega_2-\omega_1$ are largely generated relatively, a signal distortion generator can be made by using the FET operating at its region.

In case of making the distortion generator, the gate-source voltage Vgs may be divided into two regions $\Delta V_{3-1}$, $\Delta V_{3-2}$ by a code of $g_3$ as shown in FIGS. 4a and 4b. In a case of using a $\Delta V_{3-1}$ region, there is no consumption of current since the gate-source voltage is below the threshold voltage Vth. And also, the sign of $g_3$ is a positive and the sign of $g_3$ in the output terminal is its opposite for the FET operating at the normal operation point, which is used as the amplifying terminal, therefore if output current is commonly used for the same input signal, the third-order distortion signal is cancelled. That is, a parallel cancellation for commonly using each of a gate and a drain can be used. In its shortcoming, a cancellation effect for the thirdorder distortion signal may be sensitive to a direct current bias condition of the FET used as the distortion generator since the voltage region is small in comparison with $\Delta V_{3-2}$.

In a case of using the $\Delta V_{3-2}$ region, the gate-source voltage is close to the threshold voltage Vth, so a consumption of current is small. Also, since a sign of $g_3$ is a negative and the code of $g_3$ is same concerning the FET operated at the normal operation point and used as the amplifying terminal, a phase shift by 180 degrees should be additionally performed for a distortion generator signal concerned with the same input signal, and after that, the output current should be commonly used. The 180 degrees phase shifter is needed, as the third-order distortion signal is cancelled by such procedure. Concerning a single input signal, it needs two outputs mutually different by 180 degrees in their phases and the following circuit may be presented on the subject of actual signal amplification.

Figure 5:
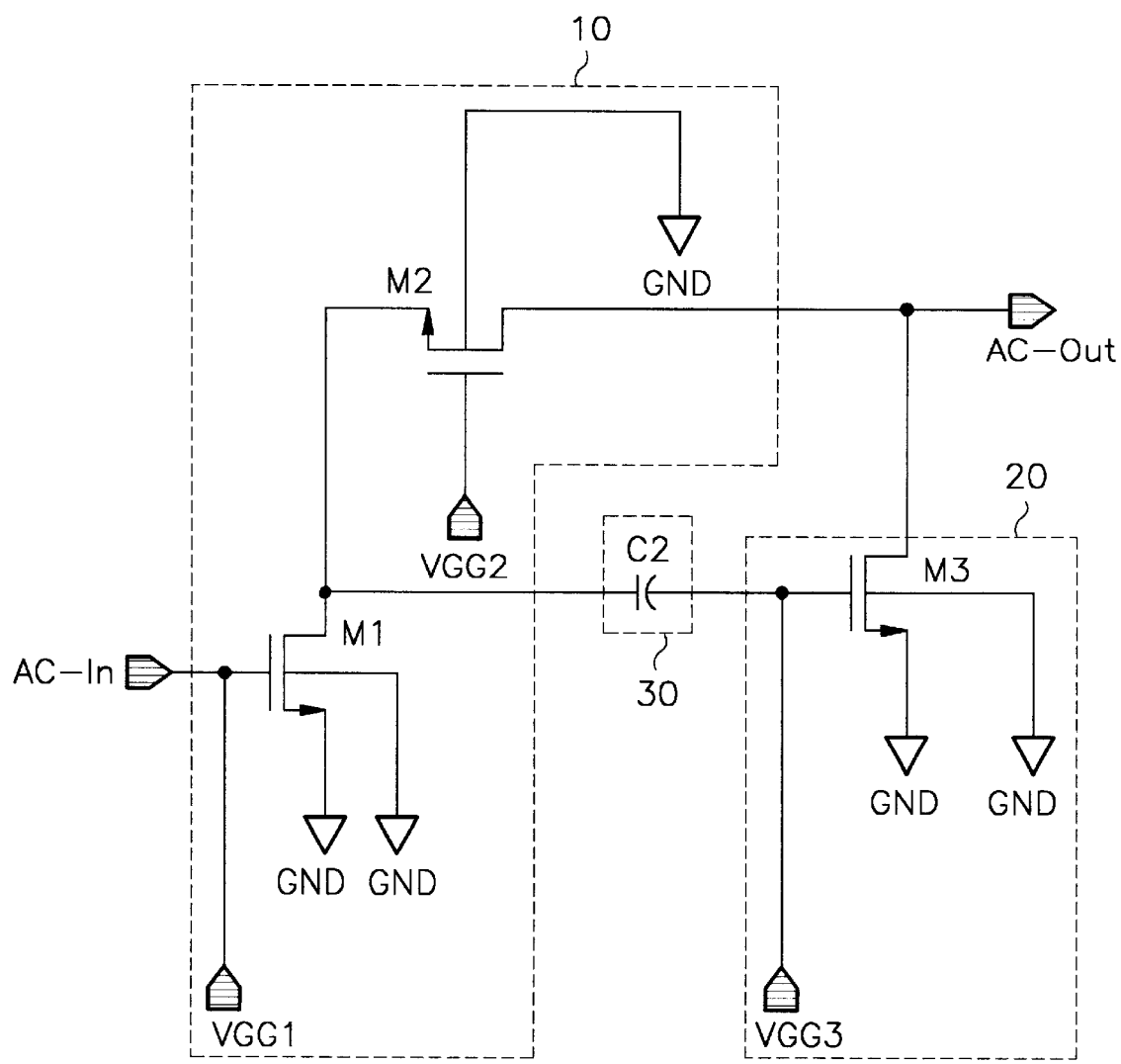
FIG. 5 shows a circuit diagram in accordance with the present invention.

In the basic concept of the present invention prior to a description of FIG. 5, a FET exhibiting characteristics in that the smaller the third-order differential value $g_3$ magnitude of the gate voltage for drain current in the FET is, the more the linearity of the third-order distortion signal is improved, that when a consumption of current is small equally to a small linear gain $g_1$ of a signal, the magnitude of $g_3$ is large, and that when the consumption of current is high equally to a high linear gain $g_1$ of the signal, the magnitude of $g_3$ is small. In the FET for normally amplifying a communication signal, a circuit composed of a feedback circuit and at least one active element having an operation point so that the third-order distortion signal of $g_3$ becomes large. Therefore, an additional current consumption becomes small, commonly uses only an input terminal in the FET for use of a signal amplification, and then the third-order distortion signal which is feedback from the added circuit is inputted to the FET for use of the signal amplification and is amplified therein, to thereby cancel the original communication input signal by the third-order distortion signal generated by the nonlinearity of the FET on the condition of the same magnitude and a different phase and to improve the third-order intercept point(IP3).

This circuit is composed of a signal amplifier 10 driven by external individual direct current gate power VGG1, VGG2, for receiving a communication input signal AC-In and performing a cascade amplification at a normal operation point where a feedback third-order distortion signal becomes large; a distortion signal generator 20 driven by external direct current gate power VGG3 different from the above power VGG1 and VGG2, for generating the communication input signal AC-In as a third-order distortion signal by nonlinearity of an active element in order to cancel the third-order distortion signal amplified in the signal amplifier 10; and an insulator 30 provided for an insulation from the external driving power VGG3 applied to the distortion signal generator 20.

The signal amplifier 10 uses at least two common-source FET M1, M2, the distortion signal generator 20 uses at least one common-source FET M3, and the insulator 30 uses a capacitor C1.

The detailed operation and connection construction are described as follows.

FIG. 5 offers a circuit diagram for improving a linearity of a small signal in accordance with the present invention.

This circuit includes two FETs M1, M2 connected in a cascade and used as a main amplification source of a signal; a new FET M3 as a distortion generator having a drain connected to a drain of the FET M2 and a gate connected between a drain of the FET M1 and a source of the FET M2, which are composed of the direct current gate voltage VGG1, VGG2; and a capacitor C1 provided for an insulation of direct current/voltage and the direct current gate voltage VGG3 of the FET M3. Furthermore, this circuit is optimized for the magnitude and the operation point thereof so that the FETs M1,M2 operate at a normal operation point in order to amplify a signal in a general cascade amplifier, the gate voltage VGG3 of the added FET M3 is controlled under operation voltage of M1 and M2, the $\Delta V_{3-2}$ region, and a third-order distortion signal generated through the FET M3 which is the nonlinearity active element and a third-order distortion signal generated by a third-order nonlinearity of M1 and M2 are offset by commonly packaging the input signal and drain of the FET M2, to whereby improve the linearity.

Figure 6A:
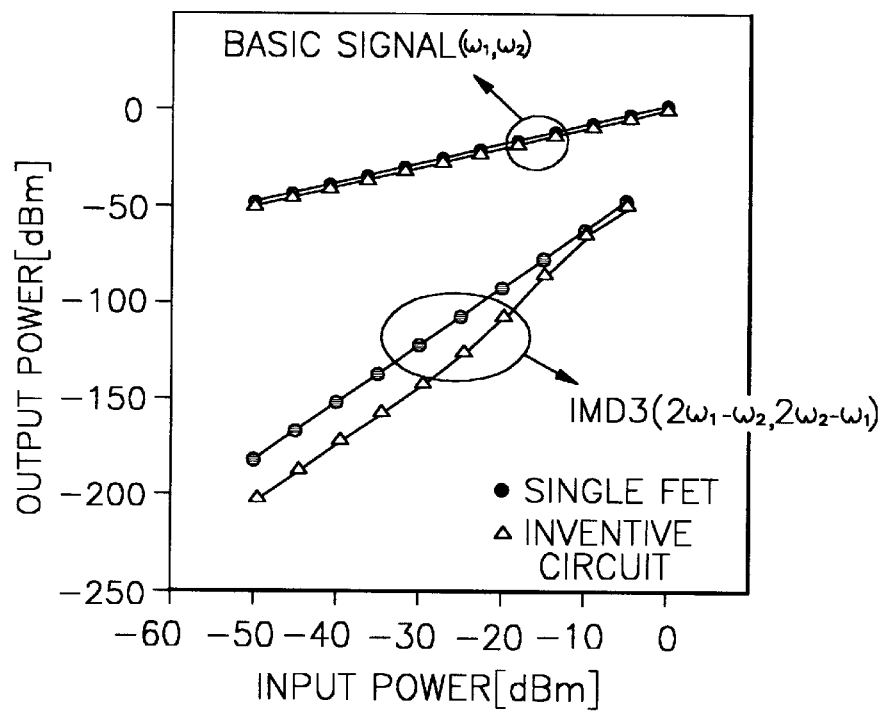
FIGS. 6a and 6b shows a comparison result between the circuits of FIGS. 4a and 5, for an improvement of an output third-order intercept point in the preferred embodiment of the present invention.
Figure 6B:
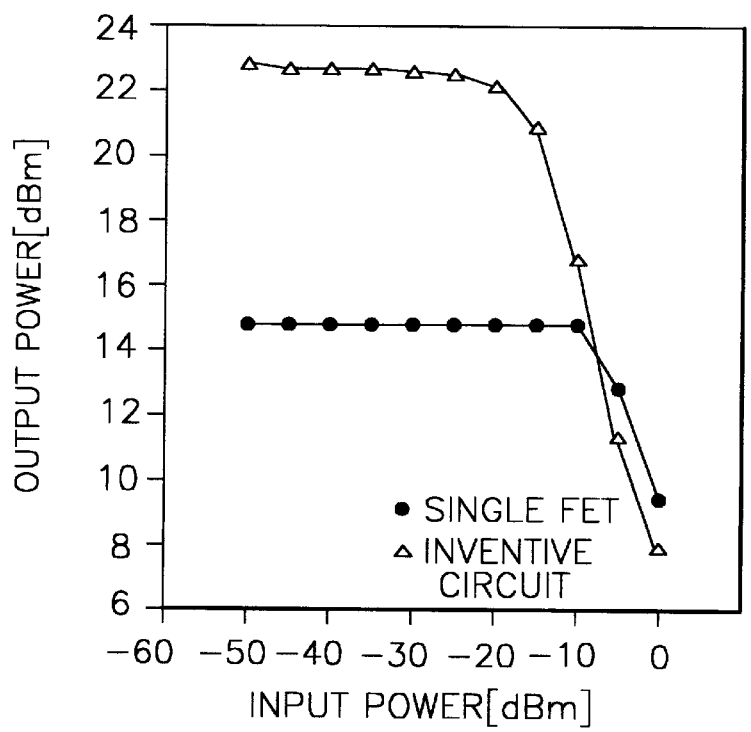

FIGS. 6a and 6b shows an executive example of the invention and a copied result presented by comparing an improvement of an output third-order intercept point in the circuit shown in FIG. 5, concerning of the single FET of FIG. 4a.

In FIGS. 4a and 4b, its first data represents the result provided in using only the FET M1, and its second data indicates the result in using the circuit of FIG. 5. In the second result of FIG. 5, the magnitude and the operation point of the FET M1 are same as the first data. As shown in FIGS. 6a and 6b, it can be noted that an output third-order intercept point of FIG. 6b improved in the circuit of FIG. 5 is improved over 6 dB in comparison with an only use of the single FET M1.

A primary method for heightening the linearity is to improve a performance of an active element, which requires a high technology for shortening a length of a gate, an expense and an endeavor. In accordance with the present invention, however, a linearity of an IC operating by a small-signal or a medium power can be heightened by using a nonlinearity characteristic difference and a gain according to gate voltage of an FET, maintaining a terminal characteristic based on a small size, lower power and high efficiency, without an additionally hard endeavor or any loss.

It will be apparent to those skilled in the art that various modifications and variations can be made in the small-signal improving RF active balun circuit of the present invention without deviating from the spirit or scope of the invention. Thus, it is intended that the present invention covers the modifications and variations of this invention provided they come within the scope of the appended claims and their equivalents.

What is claimed is:

1. A circuit for improving a linearity of an input signal in an integrated circuit (IC), the circuit comprising:
    signal amplifying means driven by external individual direct current power, for receiving the input signal and performing a cascade amplification at a normal operation point where a feedback third-order distortion signal becomes large;
    distortion signal generating means driven by an external direct current power, for generating the input signal as a third-order distortion signal by a nonlinearity of an active element in order to cancel the third-order distortion signal amplified in said signal amplifying means; and
    insulating means provided for an insulation from the external direct current power applied to said distortion signal generating means.

2. The circuit as claimed in claim 1, wherein said signal amplifying means is composed of at least two common-source FETs.

3. The circuit as claimed in claim 2, wherein said at least two common-source FETs are connected in a cascade and used as a main amplification source of signal.

4. The circuit as claimed in claim 1, wherein said distortion signal generating means uses at least one common-source FET having a drain connected to a drain of said one common-source FET and a gate connected between a source of said one common-source FET and a drain of said another common-source FET.

5. The circuit as claimed in claim 1, wherein said insulating means uses a capacitor.

6. A pre-distortion circuit to improve linearity of an input signal, comprising:
    an input terminal arranged to receive an input signal;
    an output terminal arranged to produce an output signal;
    a signal amplifier arranged to amplify the input signal, via the input terminal, and to generate the output signal, via the output terminal, said signal amplifier comprising at least two transistors arranged in a cascade and driven by first and second gate voltages for cascade amplification;
    a distortion signal generator arranged to linearize the output signal to remove nonlinear components from the output signal; and
    an insulator provided to insulate the signal amplifier from a third gate voltage applied to the distortion signal generator.

7. The pre-distortion circuit as claimed in claim 6, wherein the transistors of the signal amplifier are common-source field-effect transistors (FETs) having a gate driven by the first and second gate voltages.

8. The pre-distortion circuit as claimed in claim 6, wherein the distortion signal generator comprises a single common-source field-effect transistor (FET) having a gate driven by the third gate voltage, a drain connected to a drain of one transistor of signal amplifier.

9. The pre-distortion circuit as claimed in claim 6, wherein the insulator corresponds to a capacitor.

10. The pre-distortion circuit as claimed in claim 6, wherein the signal generator comprises:
    a first common-source field-effect transistor (FET) having a gate coupled to the input terminal and driven by the first gate voltage, and a drain coupled to ground; and
    a second common-source field-effect transistor (FET) having a gate driven by the second gate voltage, a drain coupled to the output terminal, and a source coupled to a source of the first commonsource field-effect transistor (FET).

11. The pre-distortion circuit as claimed in claim 6, wherein the third gate voltage applied to the distortion signal generator is lower than the first gate voltage applied to the signal amplifier.

12. The pre-distortion circuit as claimed in claim 6, wherein the first, second, and third gate voltages are applied to the signal amplifier and the distortion signal generator to control the cascade amplification.

13. A pre-distortion circuit to improve linearity of an input signal, comprising:
    an input terminal arranged to receive an input signal;
    an output terminal arranged to produce an output signal;
    a signal amplifier arranged to amplify the input signal, via the input terminal, and to generate the output signal, via the output terminal, said signal amplifier comprising:
        a first transistor having a gate coupled to the input terminal and driven by a first gate voltage, and a drain coupled to ground; and
        a second transistor having a gate driven by a second gate voltage, a drain coupled to the output terminal, and a source coupled to a source of the first transistor;

a distortion signal generator arranged to linearize the output signal to remove nonlinear components from the output signal; and an insulator provided to insulate the signal amplifier from a third gate voltage applied to the distortion signal generator.

14. The pre-distortion circuit as claimed in claim 13, wherein the transistors of the signal amplifier are common-source field-effect transistors (FETs) having a gate driven by the first and second gate voltages.

15. The pre-distortion circuit as claimed in claim 13, wherein the distortion signal generator comprises a single common-source field-effect transistor (FET) having a gate driven by the third gate voltage, a drain connected to a drain of one transistor of signal amplifier.

16. The pre-distortion circuit as claimed in claim 14, wherein the distortion signal generator comprises a single common-source field-effect transistor (FET) having a gate driven by the third gate voltage, a drain connected to a drain of one transistor of signal amplifier.

17. The pre-distortion circuit as claimed in claim 13, wherein the insulator corresponds to a capacitor.

18. The pre-distortion circuit as claimed in claim 13, wherein the first and second transistors of the signal generator are arranged in a cascade and driven by the first and second gate voltages for cascade amplification.

19. The pre-distortion circuit as claimed in claim 13, wherein the third gate voltage applied to the distortion signal generator is lower than the first gate voltage applied to the signal amplifier.

20. The pre-distortion circuit as claimed in claim 13, wherein the first, second, and third gate voltages are applied to the signal amplifier and the distortion signal generator to control the cascade amplification.

* * * * *